(12) United States Patent
Tsironis

(10) Patent No.: US 12,155,364 B1
(45) Date of Patent: Nov. 26, 2024

(54) VERY LOW FREQUENCY TUNER WITH ADJUSTABLE DIELECTRIC

(71) Applicant: Christos Tsironis, St-Laurent (CA)

(72) Inventor: Christos Tsironis, Kirkland (CA)

( * ) Notice: Subject to any disclaimer, the term of this patent is extended or adjusted under 35 U.S.C. 154(b) by 117 days.

(21) Appl. No.: 17/541,404

(22) Filed: Dec. 3, 2021

(51) Int. Cl.
  *H03H 7/40* (2006.01)
  *H01G 5/013* (2006.01)
  *H01G 5/014* (2006.01)

(52) U.S. Cl.
  CPC ............ *H03H 7/40* (2013.01); *H01G 5/0132* (2013.01); *H01G 5/014* (2013.01)

(58) Field of Classification Search
  CPC ...... H03H 7/38; H03H 2007/386; H03H 7/40; H01G 5/0132; H01G 5/014; H01P 5/04; H03J 3/20; H03J 1/06; G01R 31/2822; G01R 27/28; G01R 27/32; G01R 31/2612; G01R 35/005; G01R 31/2621; G01R 27/04; G01R 31/2601; G01R 31/2614; G01R 31/2607; G01R 31/2608; G01R 29/26
  See application file for complete search history.

(56) References Cited

U.S. PATENT DOCUMENTS

| | | | | |
|---|---|---|---|---|
| 5,162,972 A * | 11/1992 | Gripshover | .......... | H01G 5/0132 361/327 |
| 7,646,267 B1 | 1/2010 | Tsironis | | |
| 7,646,268 B1 * | 1/2010 | Tsironis | .......... | H01P 5/04 333/263 |
| 8,497,745 B1 * | 7/2013 | Tsironis | .......... | H03H 7/38 333/32 |
| 8,912,861 B1 * | 12/2014 | Tsironis | .......... | H01G 5/06 333/32 |
| 9,647,629 B1 * | 5/2017 | Tsironis | .......... | H03H 7/38 |
| 9,893,717 B1 * | 2/2018 | Tsironis | .......... | H01G 5/019 |
| 10,290,428 B1 * | 5/2019 | Tsironis | .......... | H01G 5/014 |
| 11,716,068 B1 * | 8/2023 | Tsironis | .......... | G01R 31/31905 333/17.3 |
| 2004/0239446 A1 * | 12/2004 | Gurvich | .......... | H03F 1/3229 333/156 |

OTHER PUBLICATIONS

"Load Pull Measurements" [online], Wikipedia [retrieved on Nov. 18, 2016] Retrieved from Internet <URL:http://en.wikipedia.org/wiki/Load_pull>.

(Continued)

*Primary Examiner* — John W Poos

(57) ABSTRACT

A low RF frequency electro-mechanical load pull impedance tuner uses four rotary, remotely controlled variable shunt capacitors and four fixed series transmission lines to create up to $10^8$ independently controllable impedance states at each frequency covering the entire Smith chart in the frequency range between below 1 and 5 MHz; the capacitors and control motors and gear are immersed in a mixture of dielectric fluids inside individual sealed containers including also adequate liquid stirring mechanisms. Appropriate, Error Function based optimization algorithms, allow fast impedance tuning at the fundamental frequency at the output of DUT's operated in high gain compression. Stepper motors, drivers and control software are used to remotely control the variable shunt capacitors of the tuner and allow it to be automated, pre-calibrated and used in an automated load pull measuring setup.

6 Claims, 19 Drawing Sheets

(56) References Cited

OTHER PUBLICATIONS

"Computer Controlled Microwave Tuner—CCMT", Product Note 41, Focus Microwaves Jan. 1998.
"Variable capacitor" [online], Wikipedia [retrieved on Nov. 3, 2021] Retrieved from Internet <URL: https://en.wikipedia.org/wiki/Variable_capacitor>.
"Search algorithm" [online]. Wikipedia [retrieved on Oct. 7, 2021] Retrieved from Internet <URL: <https://en.wikipedia.org/wiki/Search_algorithm>.

* cited by examiner

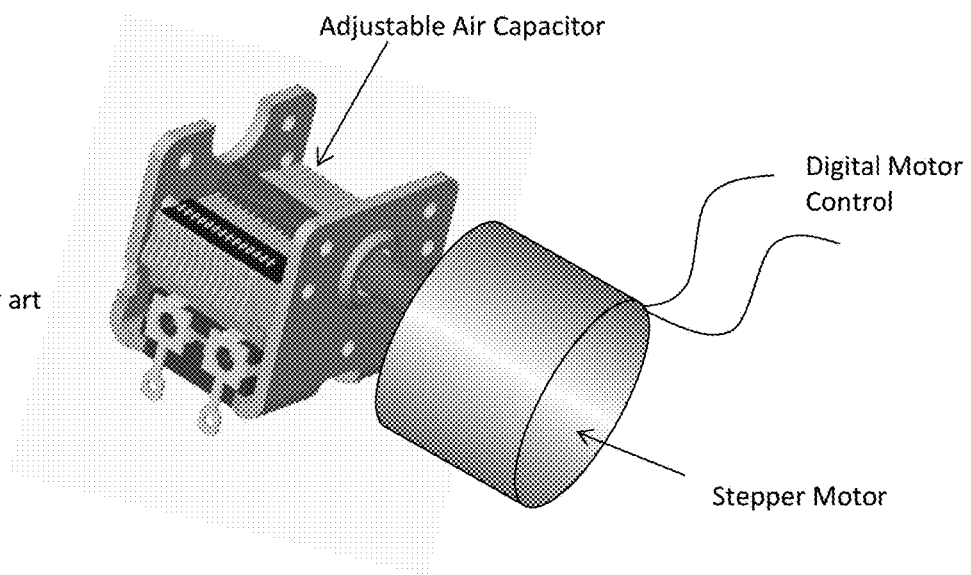
FIG. 4A: Prior art
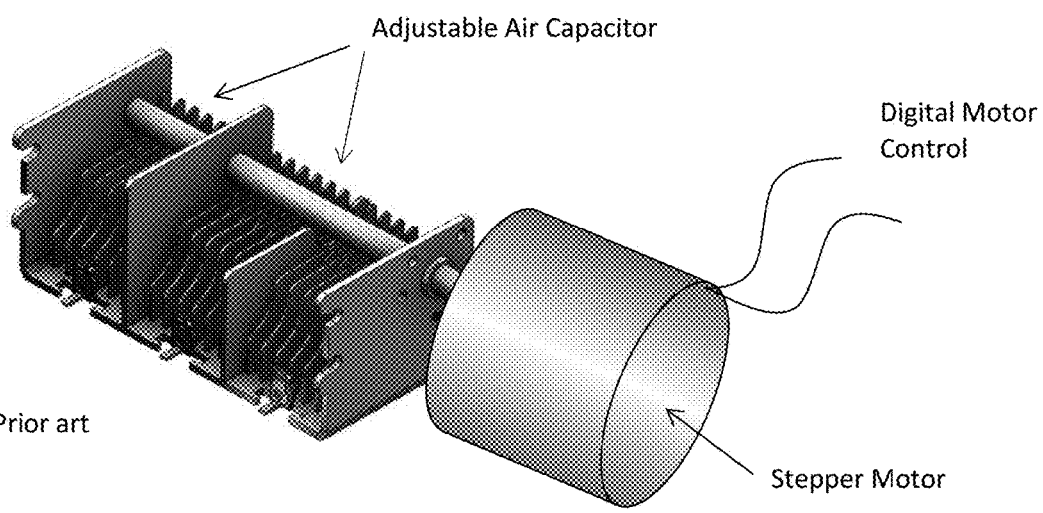
FIG. 4B: Prior art

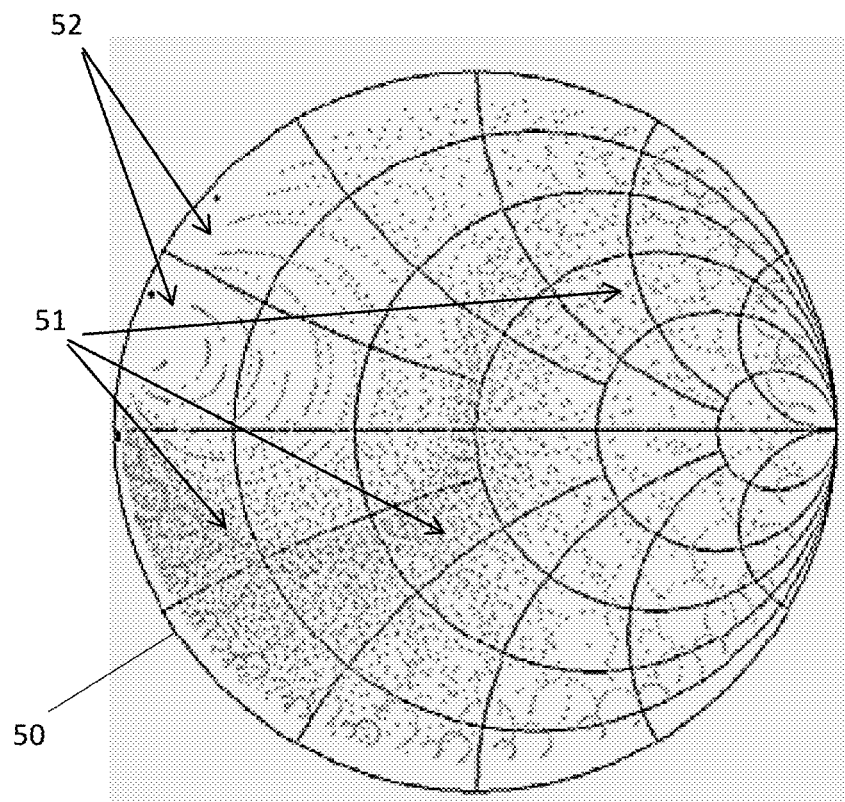
FIG. 5: Prior art

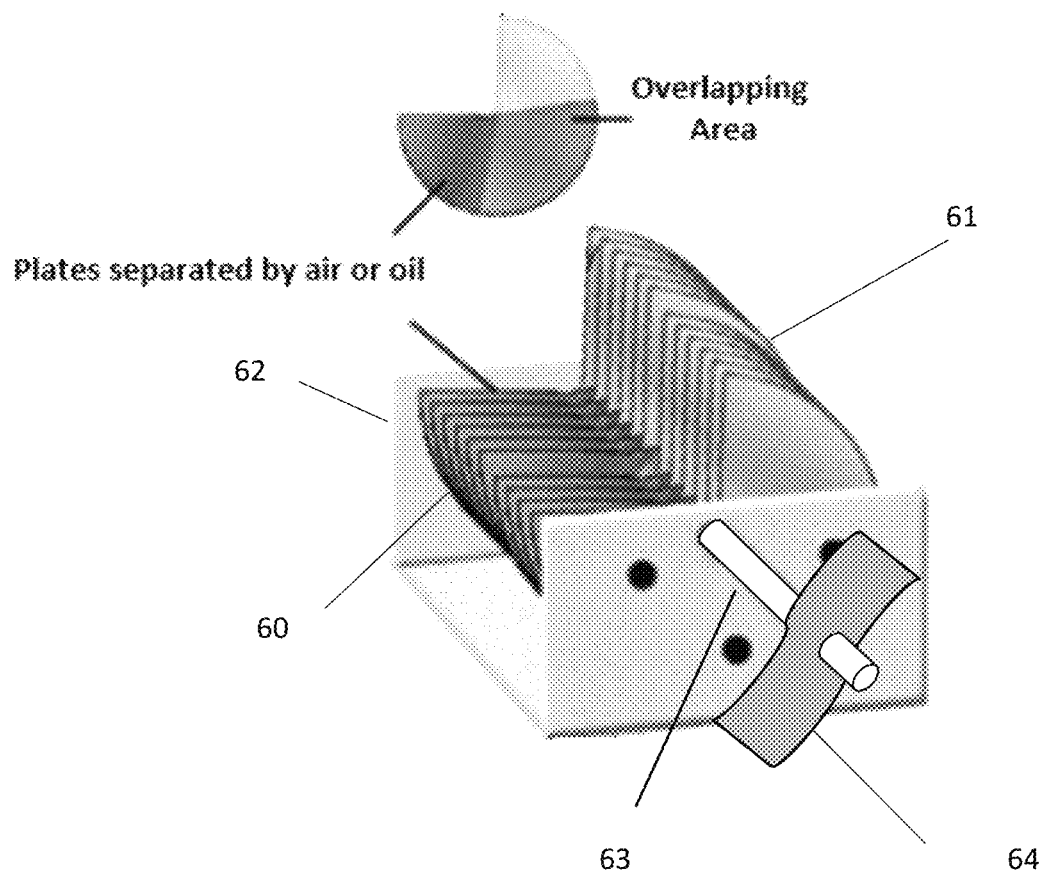
FIG. 6: Prior art

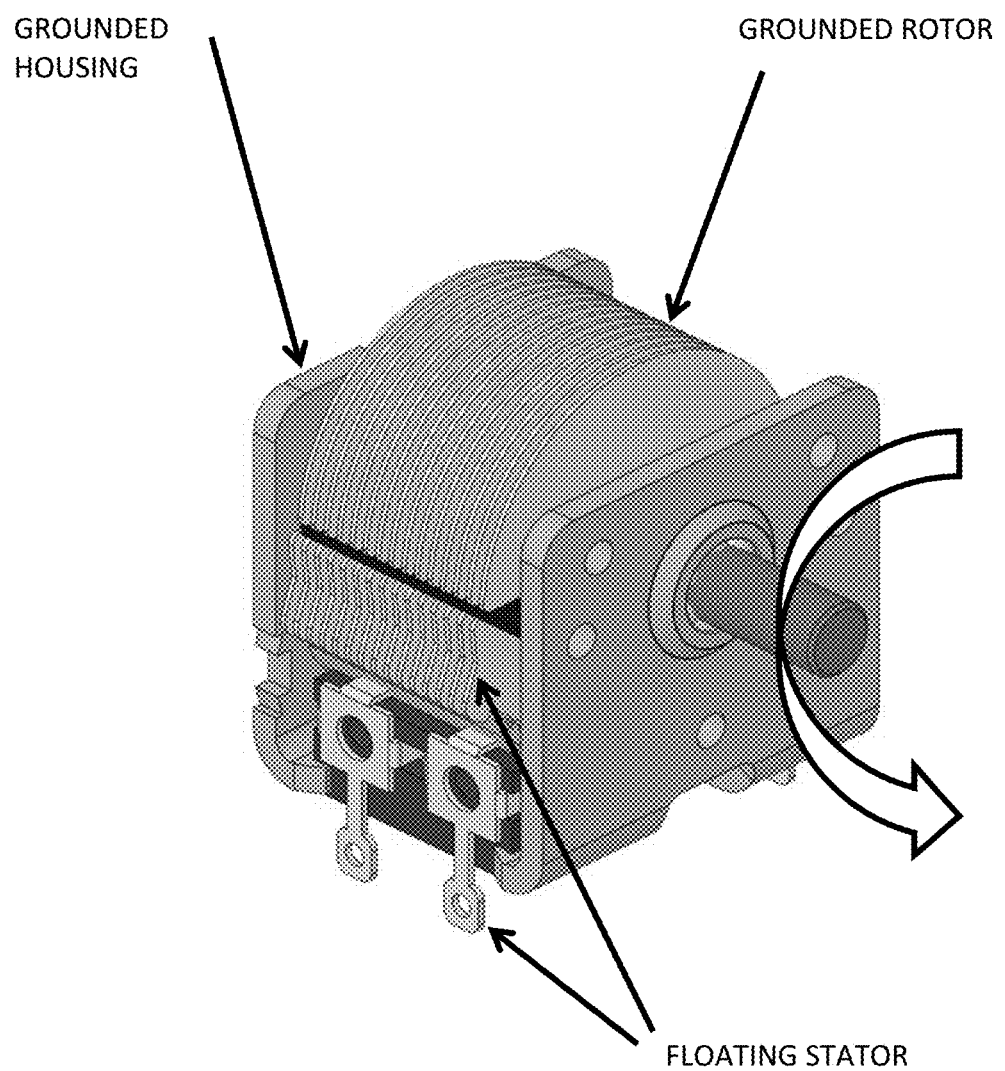
FIG. 7: Prior art

|  |  | S11 | Phy11 | r ser | C, pf | tand |
|---|---|---|---|---|---|---|
| Cmin | air | 0.00111 | -100.938 | 4249.3 | 7.2 | 0.192 |
| | mineral | 0.004398 | -93.361 | 308.3 | 28.0 | 0.054 |
| | castor | 0.010929 | -97.522 | 274.5 | 70.2 | 0.121 |
| | Glycerine | 0.111957 | -101.321 | 18.8 | 726.9 | 0.086 |
| Cmax | air | 0.089822 | -98.999 | 18.5 | 579.0 | 0.067 |
| | mineral | 0.191771 | -104.665 | 8.0 | 1262.0 | 0.063 |
| | castor | 0.37015 | -117.196 | 5.0 | 3649.7 | 0.098 |
| | Glycerine | 0.852055 | -154.797 | 1.0 | 12284 | 0.167 |

FIG. 14

| Angle | Air | Mineral Oil | Castor | Glycerin |
|---|---|---|---|---|
| min | 3 | 19 | 55 | 730 |
| Max | 575 | 1261 | 2667 | 11730 |

FIG. 16

VERY LOW FREQUENCY TUNER WITH ADJUSTABLE DIELECTRIC

PRIORITY CLAIM

Not Applicable

CROSS-REFERENCE TO RELATED ARTICLES

1. "Load Pull Measurements" [online], Wikipedia [retrieved on Nov. 18, 2016] Retrieved from Internet <URL:http://en.wikipedia.org/wiki/Load_pull>.
2. "Computer Controlled Microwave Tuner-CCMT", Product Note 41, Focus Microwaves January 1998.
3. Tsironis, C., U.S. Pat. No. 7,646,267, "Low frequency electro-mechanical impedance tuner".
4. "Variable capacitor" [online], Wikipedia [retrieved on Nov. 3, 2021] Retrieved from Internet <URL: https://en.wikipedia.org/wiki/Variable_capacitor>.
5. "Search algorithm" [online]. Wikipedia [retrieved on Oct. 7, 2021] Retrieved from Internet <URL: <https://en.wikipedia.org/wiki/Search_algorithm>.
6. Tsironis, C., U.S. Pat. No. 8,912,861, "Mechanically controlled variable capacitors for impedance tuners".

BACKGROUND OF THE INVENTION AND PRIOR ART

This invention relates to load pull testing of transistors and amplifiers at very low RF frequencies under high power operating conditions, using automatic impedance tuners in order to synthesize impedances at the input and output of the test devices (DUT).

Accurate design of high-power amplifiers, oscillators and other active components used in various communication systems requires accurate knowledge of the active device's (RF transistor's) characteristics under high power operation conditions. In such circuits, it is insufficient and inaccurate to describe transistors, operating at high power in their highly non-linear regions close to saturation, using analytical or numerical models only. Instead, the transistors need to be characterized using specialized test setups under the actual operating conditions.

A popular method for testing and characterizing such components (transistors) under high power operation conditions is "load pull" and "source pull". Load pull (see ref. 1) or source pull are measurement techniques employing RF impedance tuners and other RF test equipment, such as RF signal sources and RF power meters. The impedance tuners are used in order to manipulate the microwave impedances presented to and under which the Device under Test (DUT, amplifier or transistor) is tested (FIG. 1).

There are essentially three types of tuners used in such test setups: a) Electro-mechanical slide screw tuners, see ref. 2, b) electronic tuners and c) active tuners. Electro-mechanical slide screw tuners have several advantages compared to electronic and active tuners, such as long-term stability, higher handling of microwave power, easier operation and lower cost. These tuners are based on controlling capacitors, either rotary variable capacitors for frequencies below 100 MHz (see ref. 3, 4), or by approaching a grounded conductive tuning probe (slug) to the center conductor of a transmission line for frequencies above 100 MHz and up to 120 GHz (see ref. 2). In this type of tuner semi-cylindrically bottomed RF probe (slug) is inserted into the slot of a slotted transmission airline and allows reflecting part of the power coming out of the DUT and creating a complex reflection factor ($\Gamma$) or complex impedance (Z) that is presented to the DUT. The relation between $\Gamma$ and Z is: $Z=Zo*(1+\Gamma)/(1-\Gamma)$; where Zo is the characteristic impedance of the transmission line (slabline) in which the slug is inserted.

There are two major obstacles for making such electromechanical slide screw tuners working at radio frequencies below 100 MHz: One is the limited achievable capacitance between the RF probe and the central conductor and the other is the required length of the transmission line of the tuner. Electromechanical slide screw tuners need to be at least one half of a wavelength ($\lambda/2$) long, in order to be able to create a phase rotation by at least 360° in order to synthesize reflection factors $\Gamma$ covering the entire Smith Chart. At a frequency of 1 GHz this corresponds to a length of 15 centimeters, at 100 MHz this becomes 1.5 meters and at 10 MHz it becomes 15 meters. It is obvious that it is practically impossible to manufacture precise slotted airlines (slablines) bigger than 1.5 to 2 meters and use them in a RF laboratory environment. Or the minimum realistic frequency for slide screw tuners is 100 MHz.

A new low frequency tuner topology has been introduced in ref. 3. In this case three mechanically variable air capacitors (see ref. 4) are used, which are separated by lengths of coaxial RF cable. This compact configuration allows tuning over a certain frequency range of reflection factors. This tuner uses fixed lengths of semi-rigid cable in coil form in series between shunt capacitors and has, therefore limited frequency bandwidth up to an octave. The limited maximum capacitance of reasonably priced rotating air capacitors to around 1500-2000 pF on the other hand restricts tuning towards low frequencies to 10 MHz. To create 1 MHz tuners capacitances between 12,000 and 25,000 pF are needed. Assuming 10 settings of each capacitor, between minimum value and maximum value, the total number of states will be 1000. Because the length of cables between capacitors is fixed the phase of the reflection factors cannot be rotated. This limits the tuning range at frequencies close to the one for which the transmission line lengths have been optimized (see ref. 5).

A new tuner structure is described here which uses four sets of capacitors to increase the tuning frequency coverage and transmission line and high value rotating air capacitors submerged to mixtures (emulsions) of moderate epsilon ($\varepsilon_r$=2-5) and high epsilon ($\varepsilon_r$=40-60) dielectrics to adjust and reduce the minimum frequency of operation.

BRIEF DESCRIPTION OF THE INVENTION

The new tuner employs four "transmission line-capacitor" tuning modules to increase the frequency (F) range coverage. It also employs rotative capacitors submerged in an emulsion of dielectric oils to increase the maximum capacitance value and create low enough capacitive reactance ($1/\omega C$) to generate high enough reflection $S11=(1-j\omega C/Yo)/(1+j\omega C/Yo)$, where $Yo=20$ mS and $\omega=2\pi*F$; when F decreases C must increase to increase the controllable ratio $\omega C/Yo \gg 1$ even at very low frequencies F; at F=1 MHz the capacitance needed to obtain S11=0 or Y=20 mS is C=160 pF; to obtain |S11|=0.95 the capacitance needed is C=8,100 pF, in which case $\omega C$=0.51 mS; ordinary rotary air capacitors cannot do that. Therefore, the proposed solution includes stepper motor remotely controlled rotary air capacitors entirely submerged in high epsilon ($\varepsilon_r$) low loss dielectric liquid mixtures of mineral ($\varepsilon_r$=2.1) or castor ($\varepsilon_r$=4.7) oil and glycerin ($\varepsilon_r$=40-50). Additional benefits of this solution are the increased breakdown voltage between the rotating capacitor plates 60, 61 (FIG. 6) and thus increased RF power handling, and the flexibility to adjust the effective dielectric constant by varying the mixture of dielectric fluids using blades 64 and thus move the capacitance limits and the frequency range without changing the capacitors.

Introducing liquids in a RF measurement instrument is unusual. Leakage must be eliminated and long-term effects minimized. The solution adopted in this case includes a sealed container which includes the rotary capacitor itself, the stepper motor, a limit switch for capacitor initial setting reference, a liquid stirring mechanism and sealed feed-through DC and RF cable plugs (FIGS. 10, 11). The container can be non-metallic in order to minimize fringe capacitors reducing the controllable portion of the capacitance, or metallically shielded to avoid electro-magnetic interferences for measuring low noise transistors.

BRIEF DESCRIPTION OF THE SEVERAL VIEWS OF THE DRAWINGS

The invention and its mode of operation will be more clearly understood from the following detailed description when read with the appended drawings in which:

FIGS. 4A through 4B depict prior art: variable air capacitors controlled by stepper motors; FIG. 4A depicts a single section low capacitance capacitor and is preferably used for higher frequencies F>40 MHz; FIG. 4B depicts a triple section high capacitance capacitor and is preferably used for the lower frequencies F<40 MHz.

FIG. 5 depicts prior art: the distribution of 1000 calibration points of load pull tuner shown at a specific frequency (here Fo=40 MHz).

FIG. 6 depicts prior art: the 3D view and operation of a rotative air capacitor.

FIG. 7 depicts prior art: a photograph of a rotative air capacitor used in this invention.

FIG. 14 depicts comparison of reflection factor created by a tuning module with the capacitor immersed in various dielectric liquids together with the associated series resistance, capacitance value and loss coefficient tangent δ.

FIG. 16 depicts a min/max value comparison of the same capacitor in air or immersed in mineral oil, castor oil or glycerin; the comparison shows the effective $\varepsilon_r$ of glycerin in this case to be 20.5 by comparing the Cmax values.

DETAILED DESCRIPTION OF THE INVENTION

Figure 1:
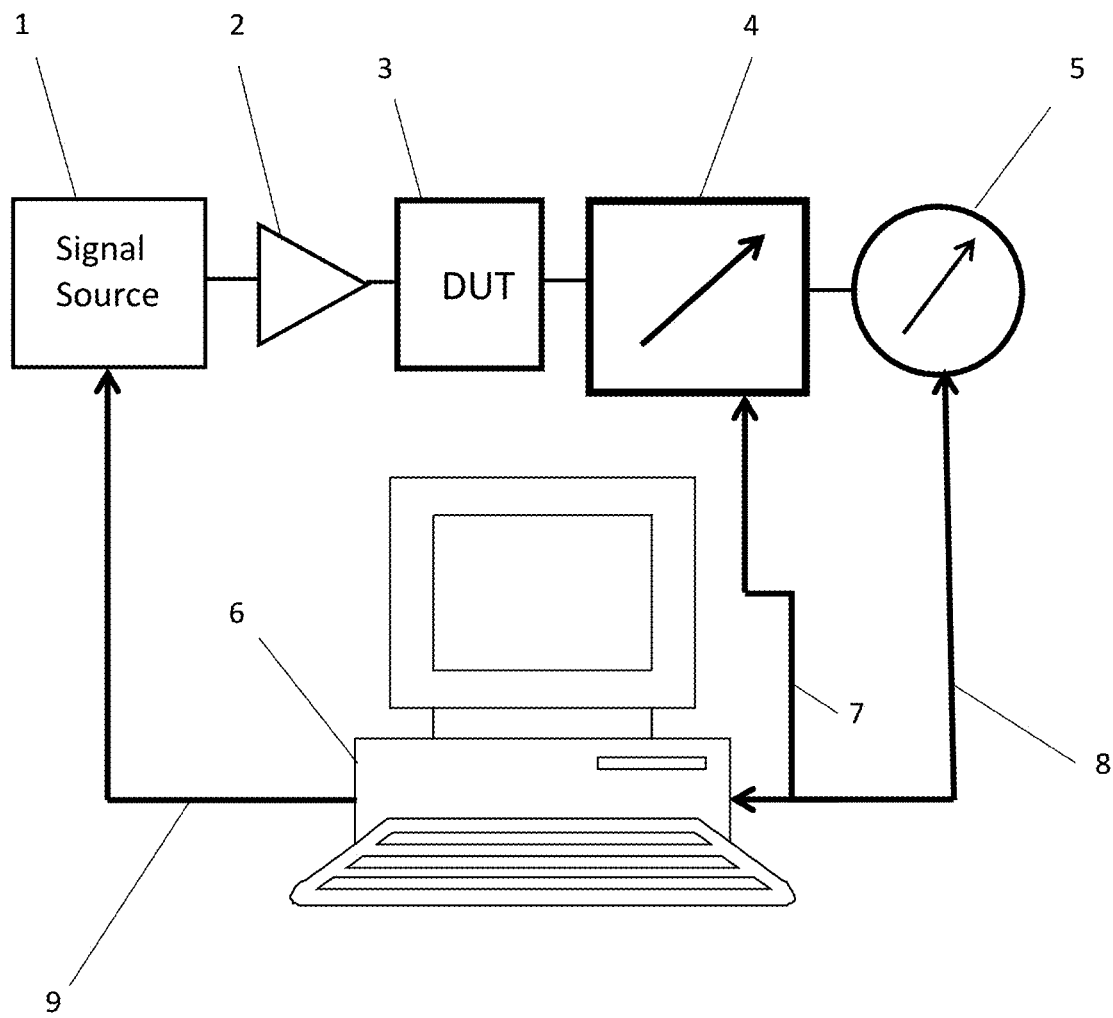
FIG. 1 depicts prior art, a load pull measurement system using wideband tuners and associated instruments. A wideband tuner can also be used at the source side of the DUT to extend the setup.

A typical load pull measurement system is shown in FIG. 1: it includes a signal source 1, a driver amplifier 2, the device under test (DUT) 3 in an appropriate test fixture, a load impedance tuner 4 and a signal receiver, or power meter, 5; the tuner is controlled by a digital cable 7 and the instruments similarly 8, 9 by a system computer 6. The tuner 4 creates a, user-defined arbitrary, load to the DUT of which the RF and DC behavior is registered by the controller 6 via the receiver 5, and are used to create ISO contours on the Smith chart; these contours allow identifying the optimum load for the specific characteristic of the DUT, this being gain, output power, efficiency etc. the tuner 4 can be replicated at the input of the DUT 3 to study also the dependence on the source impedance. The impedance tuners are available from 10 MHz to over 120 GHz. This invention presents a family of tuners covering down to 1 MHz or even lower.

Figure 2:
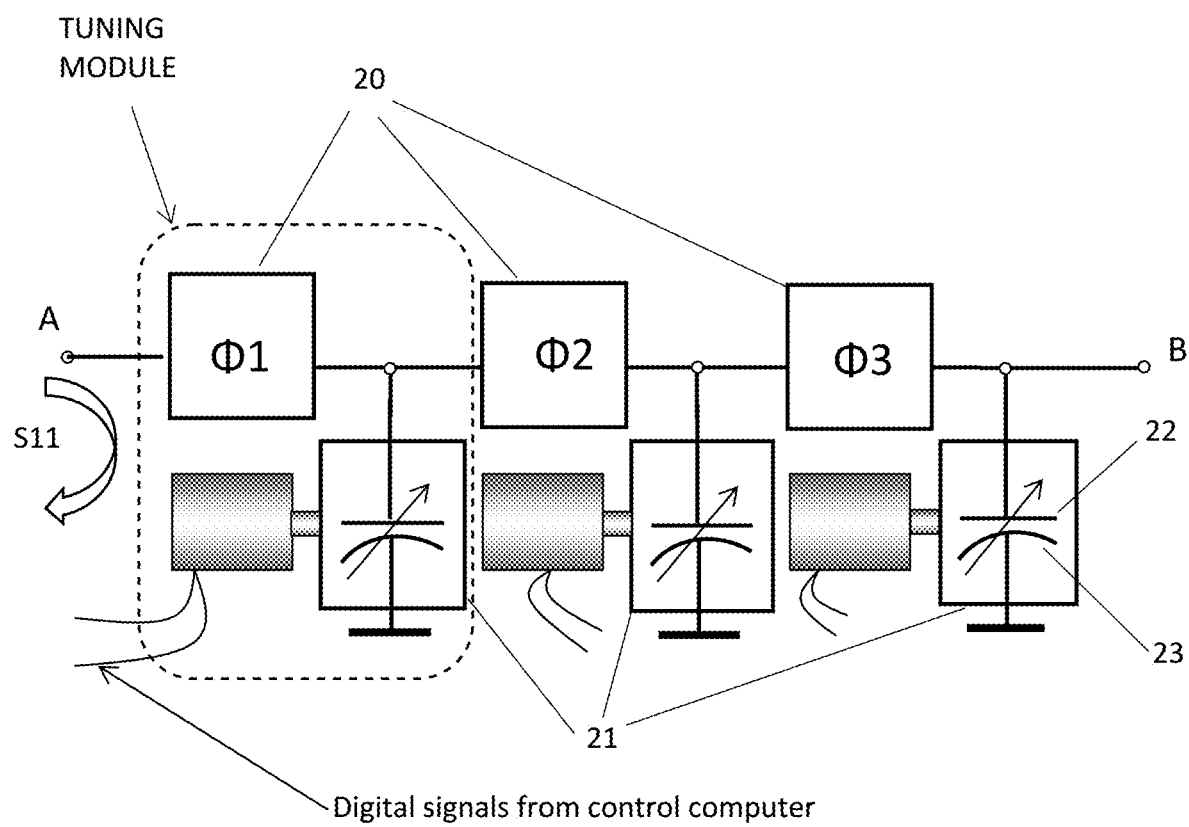
FIG. 2 depicts prior art, a three fixed phase (transmission line)-capacitor-module low frequency tuner.

The prior art low frequency tuner concept is shown in FIG. 2: it includes three motorized transmission line 20 phase shifts Φi—variable capacitor 21 modules (see ref. 3); the frequency coverage of this tuner is up to one octave; the phase shifters 20 (Φi) are coaxial cables of fixed length, optimized to create a maximum Smith chart reflection factor Γ=S11 coverage over the target frequency range (S11 is measured when port B is terminated with characteristic impedance Zo=50Ω); the capacitors are adjustable between a minimum residual value Cmin and a maximum Cmax. Because of the mechanical structure of air-filled capacitors, the minimum fringe capacitance is non-negligible, even if the rotating blades are completely disengaged (FIG. 6). This phenomenon must be considered in tuner calibration and tuning. The residual lead inductance to the stator and rotor blades of the rotary capacitor creates a combined series-parallel resonance network which, at maximum capacitance settings, limits the frequency range of the tuner.

Figure 3:
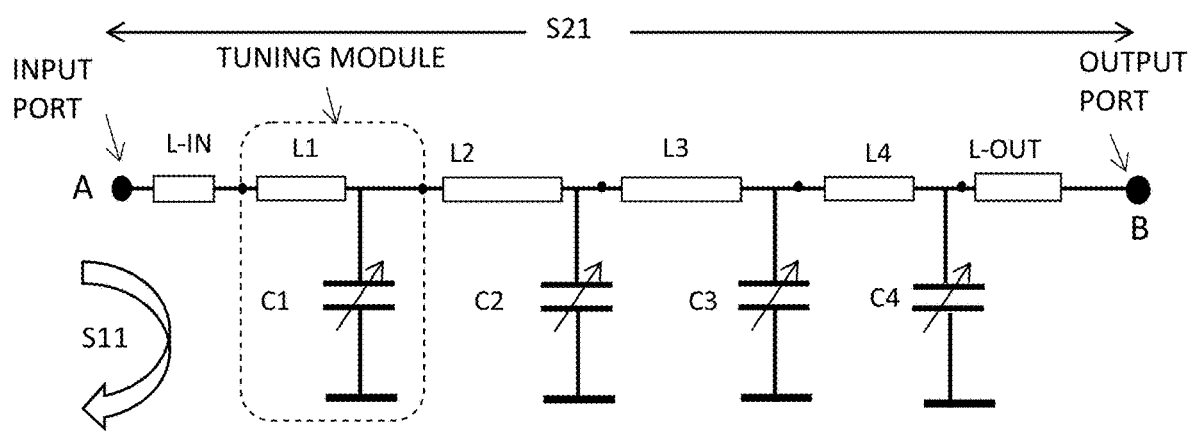
FIG. 3 depicts a low frequency wideband tuner including four transmission line-capacitor-tuning modules.

The low frequency tuner in this invention includes four transmission line-capacitor tuning modules: FIG. 3: the fixed transmission lines are L1 to L4 and the four rotary capacitors are C1 to C4; the values of L1 to L4 are accessed through lead RF cables L-IN and L-OUT and are selected (optimized) for maximum coverage of the Smith chart of S11 for any combination of capacitor values between Cmin and Cmax. Maximum capacitance does not always mean maximum overall S11, it all depends on the actual configuration: the optimization algorithm uses measured capacitance data and modelled transmission lines, using the effective dielectric constant (typically Teflon) of the coaxial cable used. The search algorithm (see ref. 5) calculates S11 as a function of L1 to L4 and C1 to C4 for a target frequency range. The capacitors are measured at 10 settings between Cmin and Cmax and the transmission lines are modified in steps of 1 to 5 cm independent on each other for frequency steps of typically ½₀ of the target frequency range; for each combination of parameters a target function TF=SUM (S11 (L1–L4, C1–C4)) is calculated for each frequency and normalized to the number of trials to cover the unitary circle (Smith chart), FIGS. 11 and 12. The results allow dimensioning the inter-module cable lengths and obtain a working tuner.

Figure 15:
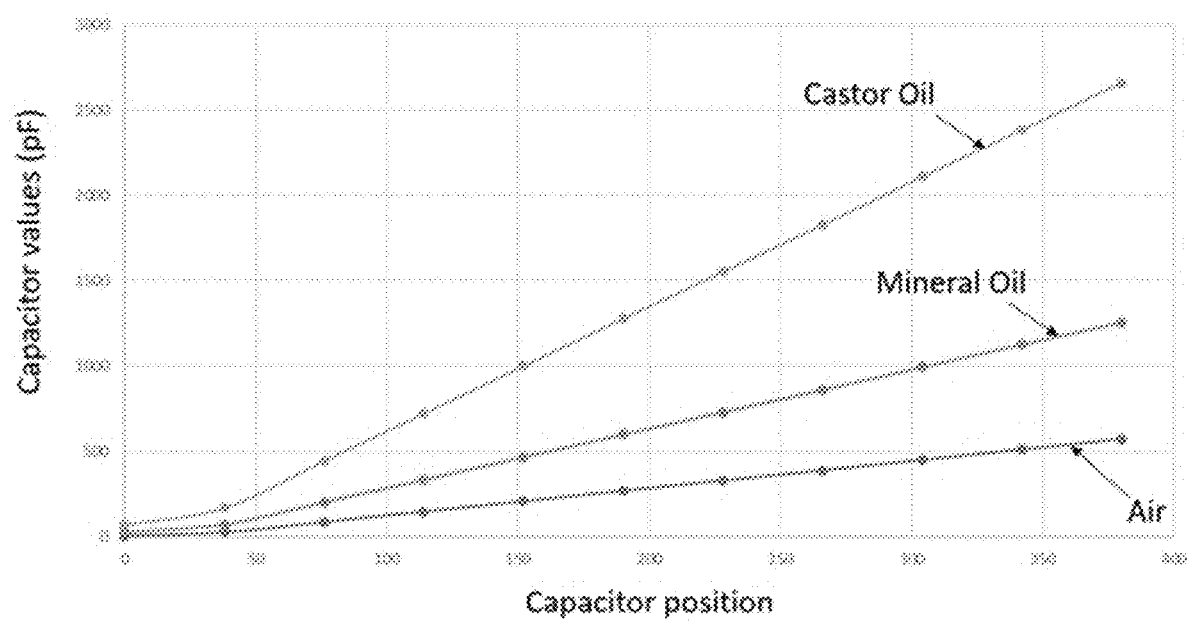
FIG. 15 depicts the linear control of the capacitance as a function of angle overlap (0.9°/step motor control).
Figure 17:
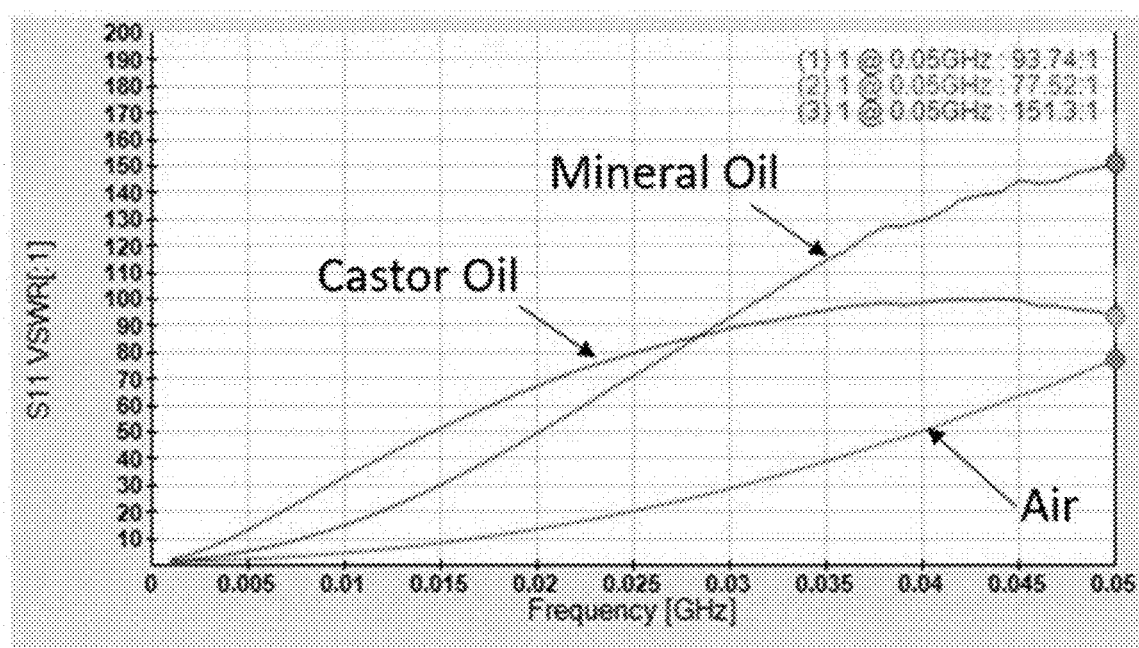
FIG. 17 depicts frequency dependence of VSWR created by a rotary capacitor in air or immersed in mineral or castor oil. Above 28 MHz castor oil saturates because of loss (see also FIG. 14).

Two versions of remotely controlled capacitors are shown in FIGS. 4A and 4B; they include one (FIG. 4A) or more (FIG. 4B) groups of parallel semi-circular blades engaging inter-digitally progressively by rotating the grounded axis (rotor 61, FIG. 6), also shown schematically 23 in FIG. 2. The non-rotating group of blades (stator) is insulated from ground (floating) as shown 22 also in FIG. 2; the stepper motors are digitally controlled by the controller and set to given angles as shown in FIG. 6, to control, linearly the capacitance value (FIG. 15). The stepper motors can be linked directly to the rotor axis of the capacitors, as shown in FIG. 4, or via a belt 102 (FIG. 10) or a (not shown) reducing gear to increase the step resolution. The typical reflection factor calibration cloud 51 generated by the tuner at any given frequency inside the operation range on the Smith chart 50 is shown in FIG. 5. Depending on the individual transmission line lengths L1-L4 certain areas 51 are densely populated and others 52 are not. The cloud 51 includes typically $10^4$=10,000 calibrated points (for 10 settings of each capacitor); however, this is insufficient for fine tuning, especially in the sparsely populated areas 52; therefore, the capacitor values are linearly interpolated numerically (FIG. 15) between calibrated points to a much higher resolution (typically 100 steps, if using ordinary 1.8° stepper motors and no transforming gear), in which case the tuning resolution is increased to $100^4$=100,000,000 tunable points; if these points were equally distributed on the Smith chart, each distinct pixel (impedance) would be a small circle (pixel) with a surface of $\pi*10^{-7}$. Even with extreme unequal point distribution, it is obvious that this easily feasible tuning resolution is entirely sufficient for all practical purposes. The tuning occurs purely by numerical search amongst the millions of possible configurations by optimizing an error function $EF=|S11-S11 \cdot target|^2$, wherein S11 is the calculated reflection factor and S11·target is the reflection factor to by synthesized. Modern computers manage this kind of data processing in fractions of a second, assuming the s-parameter permutations are saved in RAM.

Prior art schematics and pictures show the exact operation of the rotary capacitor (FIGS. 6, 7); it comprises a grounded shell 62 holding the axis 63 of a rotor 61 which carries a number of parallel mounted metallic semicircular disc-blades. RF continuity of the grounding of this assembly is critical and has been the subject of prior work (see ref. 6); if the grounding is intermittent, as the axis rotates, the tuning is useless. Opposite to the rotating blades 61 are the blades of the isolated stator 60. Linearly controlled overlapping of the two segments 60 and 61 allows linear control of the capacitance (FIG. 15) following the simple relation $C=Co+\varepsilon_0*\varepsilon_r*A/s$, where $e_0$ is the dielectric constant of dry air ($\varepsilon_0$=8.854*pF/m), $\varepsilon_r$ is the dielectric constant of the material between the blades with $\varepsilon_r$(air)=1, A is the area engaged, Co is the fringe capacitance and s the space between the blades. Using dielectric material with $\varepsilon_r$>1 increases both the maximum capacitance Cmax and the fringe capacitance Co. Reducing the space s reduces also the breakdown (spark) voltage and therefore the maximum power handling of the tuner. Using high $\varepsilon_r$ dielectric (preferably fluid) increases both C and decreases the electric field $E=V/\varepsilon_r$ where V is the voltage between the blades, proportionally, increasing this way the power handling. Potential problems in using high Er dielectric liquid are risks of leakage and reducing the series/parallel resonance frequency Fr~1/sqrt(Lo*Co) by increasing the capacitance, given the fact that any fringe lead inductances Lo remain constant.

Figure 8:
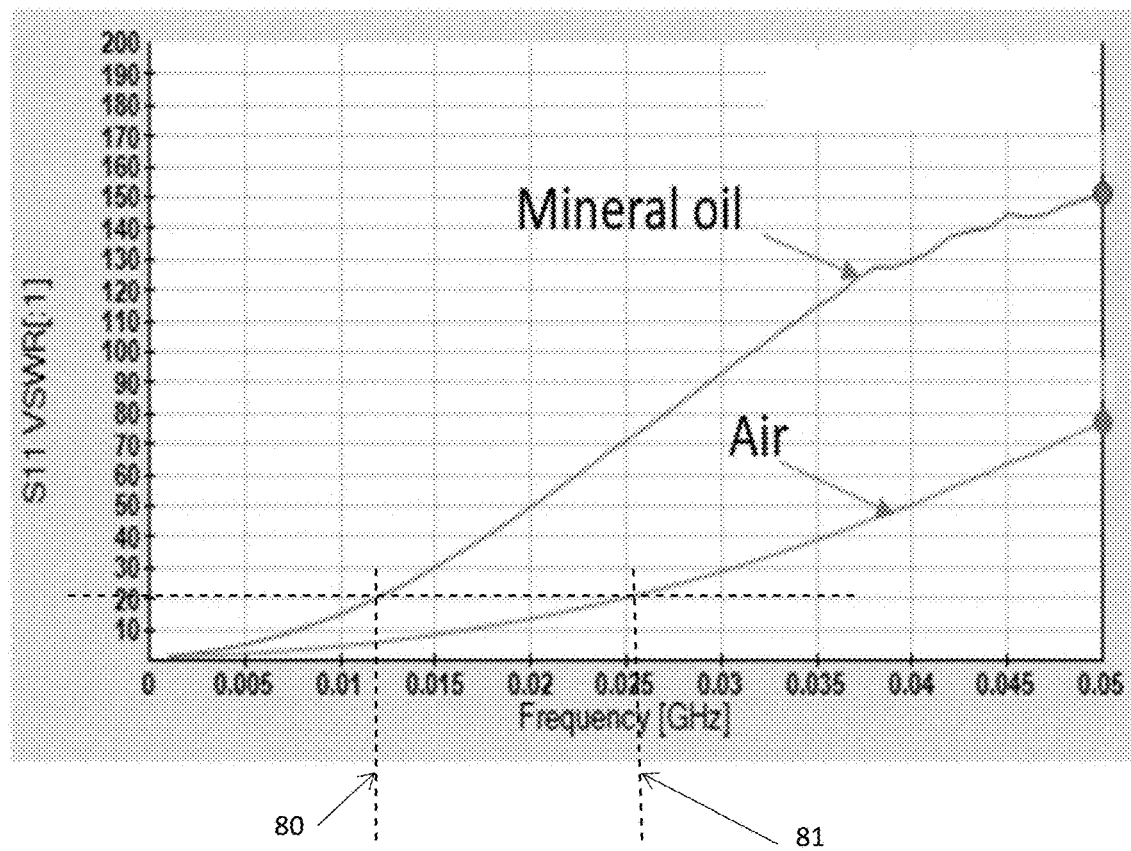
FIG. 8 depicts frequency dependence of maximum value reflection factor VSWR=(1+|S11|)/(1−|S11|) of a line-air capacitor module versus a line-mineral oil filled capacitor module.
Figure 12:
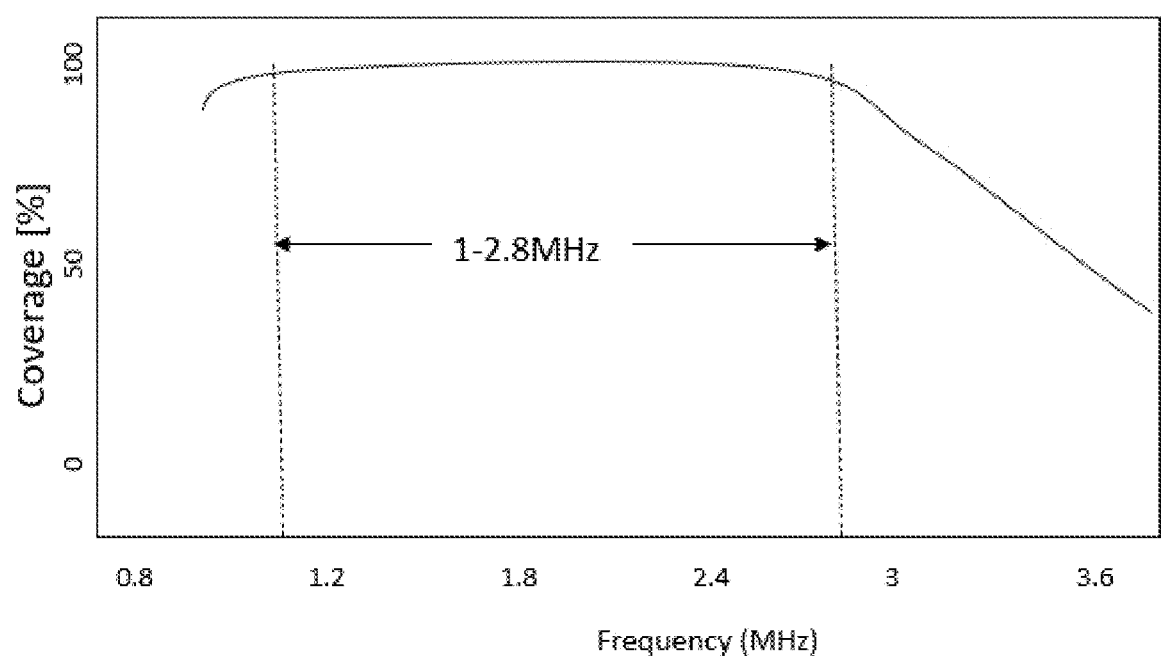
FIG. 12 depicts result showing of the expected Smith chart coverage over frequency after optimizing the transmission line lengths.
Figure 13:
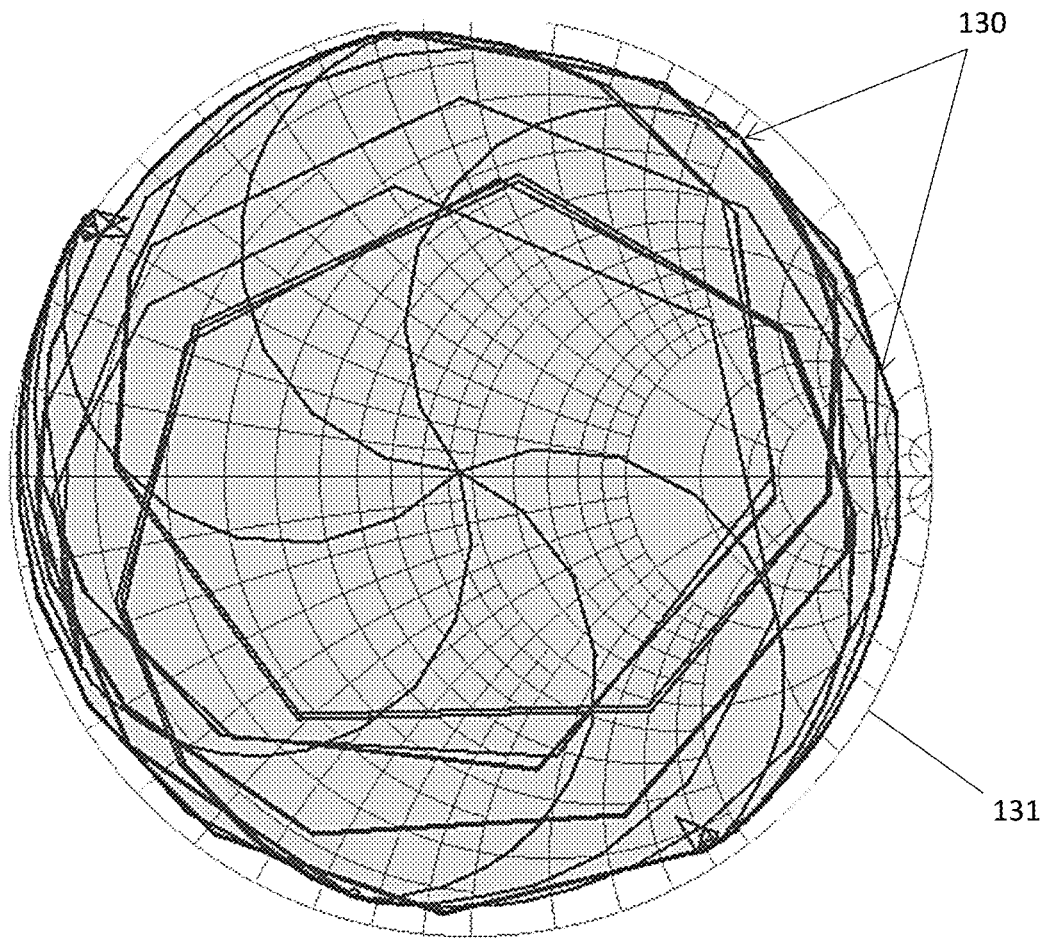
FIG. 13 depicts Smith chart coverage at a given frequency inside the optimized frequency band. The shadowed area can be reached only by setting the capacitors.
Figure 19:
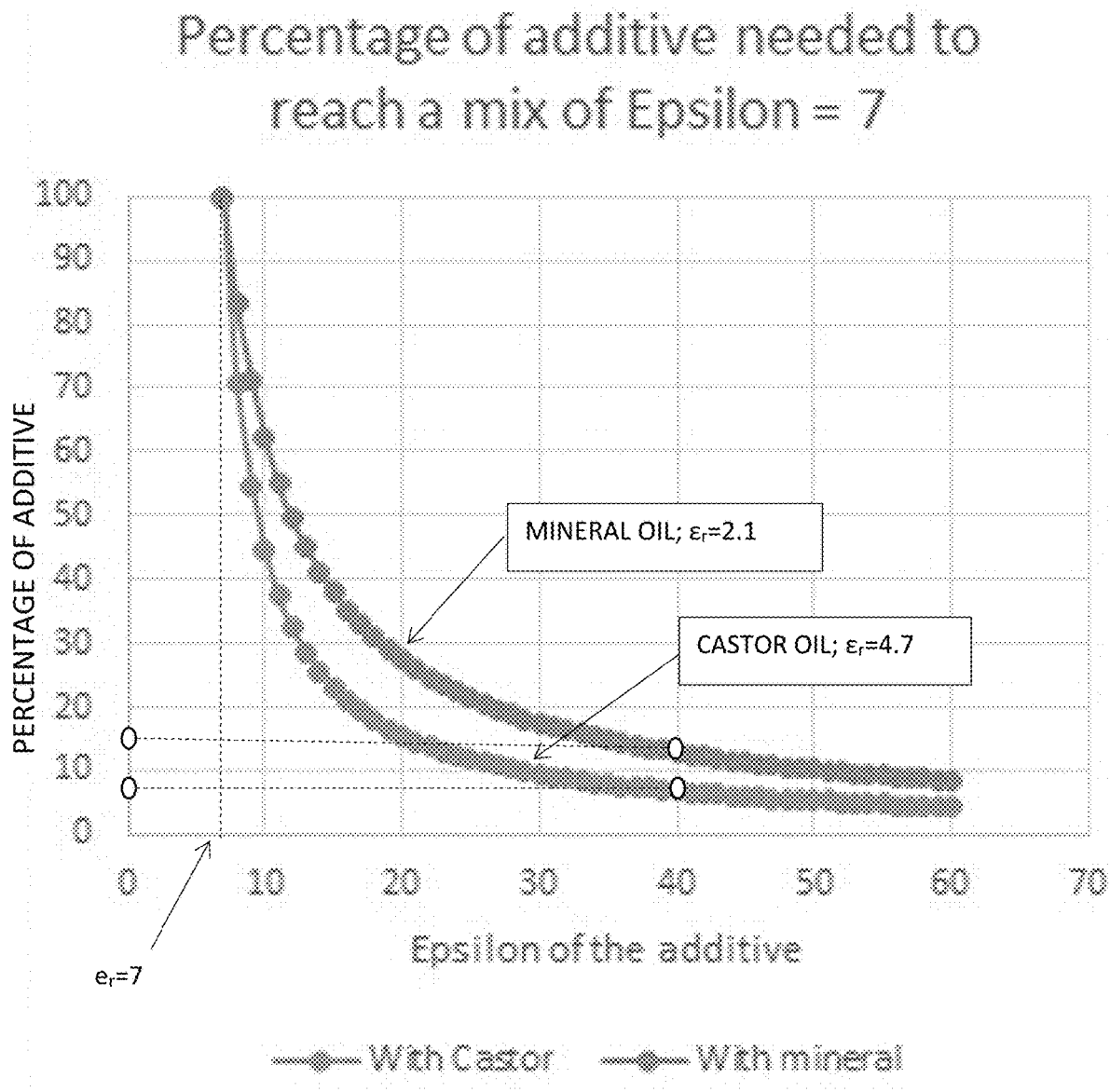
FIG. 19 depicts percentage of high epsilon additive (example: glycerin $\varepsilon_r\sim40$) infusion into mineral or castor oil, needed to generate overall $\varepsilon_r=7$.

In order to cover the Smith chart with adequate reflection factor >0.95 each transmission line-capacitor tuning module must create high enough reflection VSWR=(1+|S11|)/(1−|S11|):1; the critical value, considering unavoidable connection and insertion losses is VSWR=20:1; as shown in FIG. 8, when using air as dielectric this is not feasible at maximum capacitance setting 81 below 26 MHz; when using mineral oil as dielectric the critical value of VSWR=20:1 can be reached at 12 MHz, 80; in conclusion both higher capacitor values and higher dielectric are needed to reach minimum frequencies Fmin of 1 MHz. This requires $\varepsilon_r$>7 and can be achieved using air capacitances of 1600 pF immersed in a 7% infusion of glycerin with $\varepsilon_r \approx 40$ into Castor oil ($\varepsilon_r \approx 4.2$) (FIG. 19) or a 15% glycerin infusion into mineral oil ($\varepsilon_r \approx 2.1$). FIG. 12 shows the optimization criteria of the transmission line sizing i.e., the maximum Smith chart coverage (in %) over frequency, and in FIG. 13 the shadowed area 130 shows the actual distribution on the chart 131 itself.

Figure 10:
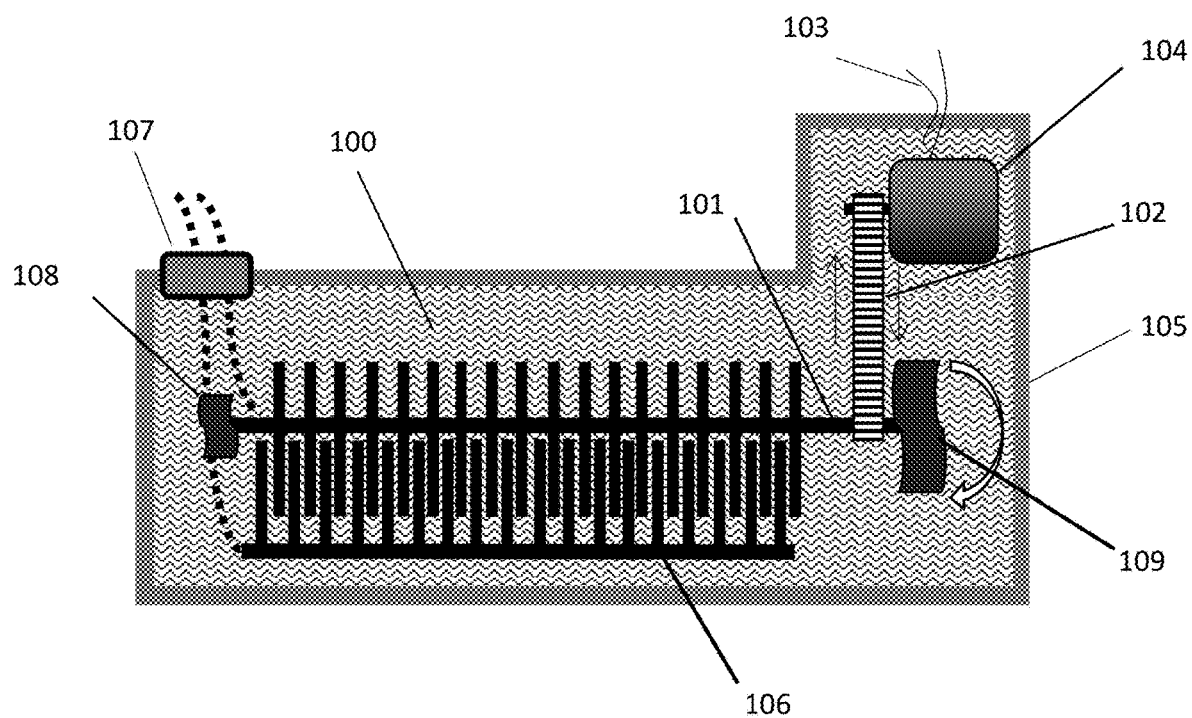
FIG. 10 depicts schematic top view of a sealed container holding a mixture (emulsion) of dielectric oil-submerged rotary capacitor, its stepper motor control and dielectric fluid stirring means using rotating blades.
Figure 11:
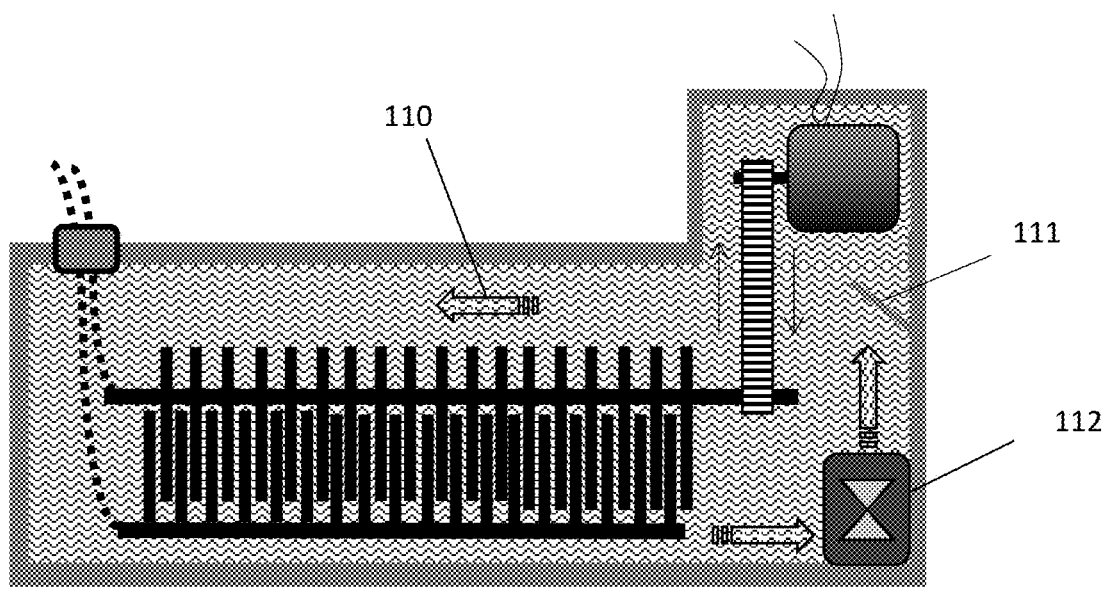
FIG. 11 depicts schematic top view of sealed container holding a mixture (emulsion) of dielectric oil-submerged rotary capacitor, its stepper motor control and dielectric fluid stirring means using an aquarium type oil pump.
Figure 18:
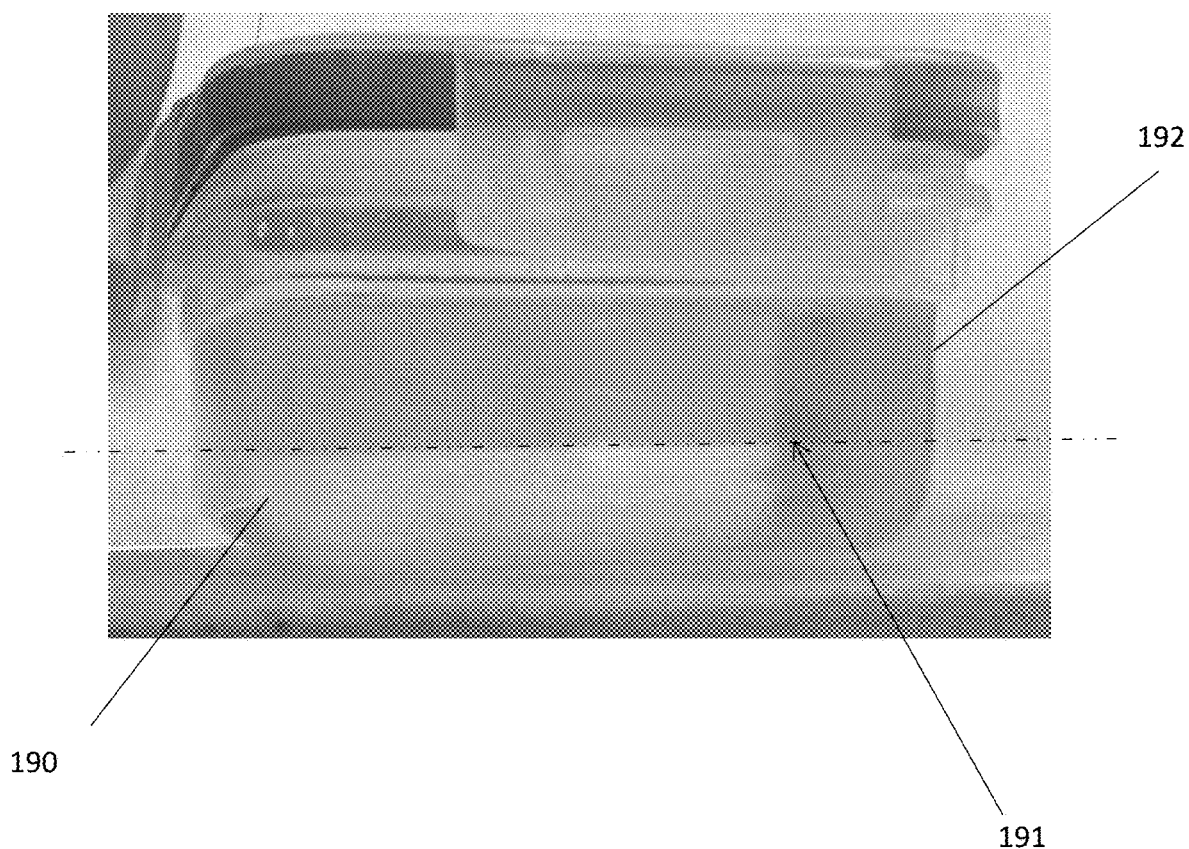
FIG. 18 depicts the distinct separation of castor oil (top) and glycerin after approximately ½ hour settling time.

FIGS. 10 and 11 show top views of two embodiments of remotely controlled capacitors immersed in a mixture (emulsion) of dielectric fluids: the sealed capacitor container 105, holding the liquid dielectric mixture 100, the rotary capacitor 101, 106, the stepper motor 104, which is remotely controlled 103 and drives the axis 101 of the rotor using a belt 102. The grounded and floating terminals of the capacitor are guided outside using RF cables and a sealed plug 107. The container 105 itself is either made of non-metallic material to reduce fringe capacitances between the capacitor blades and the housing when using high dielectric liquid, or of conductive (metallic) material in order to perform low noise measurements and shield the capacitors from possible interferences. The dielectric mixture must be stirred to keep the emulsion stable (FIG. 18). This is done either using rotating helix shaped blades 108, 109 attached to the rotor axis 101, or using a submerged (aquarium type) liquid pump 112 (FIG. 11), which moves the liquid around 110 continuously or in given time intervals. A deflection shield 111 guides the fluid into the proper circulation.

FIG. 18 shows that the different dielectric fluids do not mix, if left alone. A transparent container shows a clear separation line 191 between glycerin 190 and castor oil 192 This is why the dielectric mixture must be adequately stirred to maintain a stable dielectric behavior during the entire operation, including tuner calibration and measurement. Any change in dielectric constant will change the capacitance value and falsify the calibration data and the measured results. This stirring could be done by just the rotor and blade movement, but an additional stirring mechanism accelerates and maintains the formation of a stable operation. Changing the percentage of infused high $\varepsilon_r$ dielectric offers the possibility of adjusting the capacitance limits and thus the frequency range, without physically changing the capacitors.

In general, every tuning module behaves like a two-port and the overall tuner as a cascade of several such two-ports.

Figure 9:
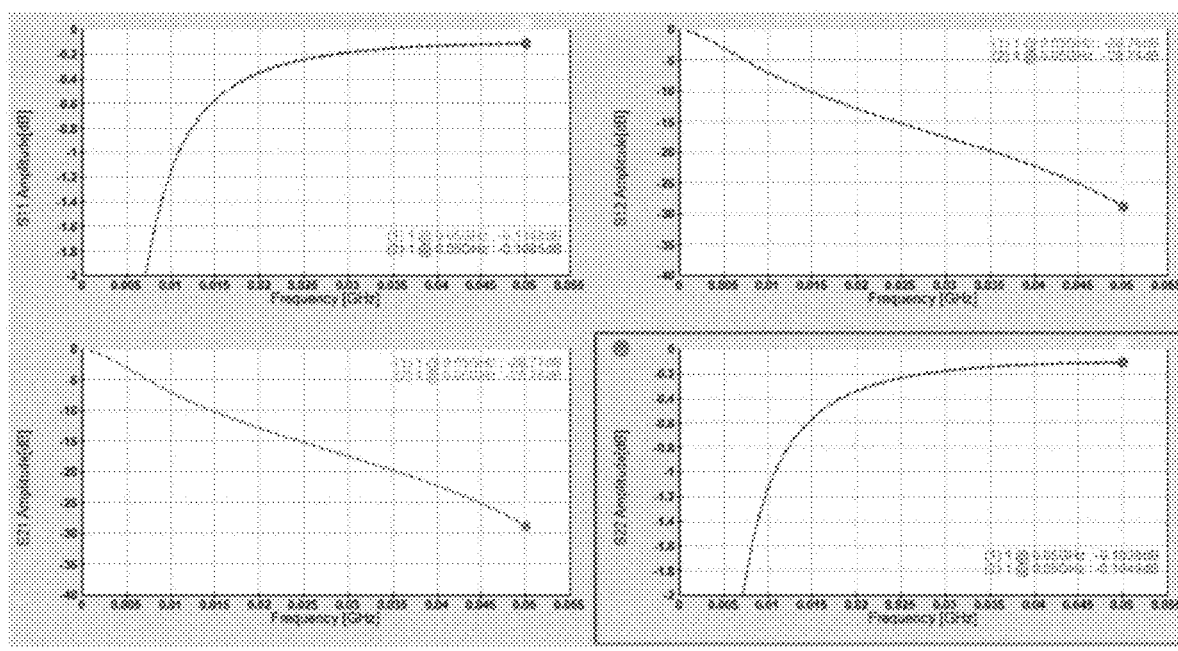
FIG. 9 depicts frequency dependence of four s-parameters of a transmission line-mineral oil filled capacitor module based two-port tuner (FIG. 3).

S-parameters of a four-stage tuner are shown in FIG. 9: the passive tuner is, of course, reciprocal (S12=S21) and the reflection factors S11 and S22 quasi-identical in amplitude even though the phases are different, since the lines precede the capacitors. The actual loss of a tuner is calculated from $(1-|S11|^2)/|S21|^2$. The specific tuner has (at 20 MHz) |S11|=−0.35 dB=0.961 and S21=−13 dB=0.224, leading to 1.83 dB loss. The use of dielectric is therefore good for boosting the capacitance value to reduce the minimum frequency but introduces important loss, which may lead to heating at high power. Immersion in an adequately stirred mixture of dielectric fluids shall therefore be used with precaution and primarily at very low frequencies around less than 1 to 5 MHZ.

The present embodiment of this invention of using capacitors immersed in high value dielectric mixtures (emulsions) to expand the operation to low MHz frequencies can easily be adapted to other types of mechanical variable capacitors; this shall not limit the basic idea and the scope of the present invention.

What is claimed is:

1. A very low frequency electro-mechanical impedance tuner comprises an input port followed by a first transmission line, an output port preceded by a second transmission line, and a cascade of at least four tuning modules inserted between the first and the second transmission lines and submerged in a continuously mixed emulsion of dielectric fluids with different dielectric permittivity $\varepsilon_r$ each;
    wherein
        each tuning module comprises a series transmission line connected to a shunt, remotely controlled variable rotary capacitor,
    and wherein
        the remotely controlled variable rotary capacitors are submerged in a container with an emulsion of dielectric fluids effectively mixed by means of an independent recirculating fluid pump.

2. The very low frequency electro-mechanical impedance tuner as in claim 1,
    wherein
        each variable rotary capacitor with its control is submerged in an individual container filled with the emulsion of dielectric fluids and includes the means for effectively mixing it;
    and wherein
        the variable rotary capacitors are connected with the associated transmission lines via sealed feedthrough plugs.

3. The very low frequency electro-mechanical impedance tuner, as in claim 2,
    wherein
        the containers is made of electrically non-conductive material.

4. The very low frequency electro-mechanical impedance tuner, as in claim 2,
    wherein
        the container is made of metal.

5. The very low frequency electro-mechanical impedance tuner, as in claim 1,
    wherein
        the means for effective mixing the emulsion of dielectric fluids comprise blades attached to an axis linked to the variable rotary capacitor.

6. The very low frequency electro-mechanical impedance tuner, as in claim 1,
    wherein
        the means for effective mixing the emulsion of dielectric fluids comprise at least one independently controlled liquid re-circulation pump.

* * * * *